United States Patent [19]

Leonhardt

[11] 4,275,035
[45] Jun. 23, 1981

[54] APPARATUS FOR ELECTRICAL FEED OF A HEATER IN A CRYSTAL-GROWING VESSEL

[76] Inventor: Maria R. Leonhardt, Mainauweg 9, D-7750 Konstanz 19, Sweden

[21] Appl. No.: 866,044

[22] Filed: Dec. 30, 1977

[30] Foreign Application Priority Data

Jun. 11, 1977 [DE] Fed. Rep. of Germany ....... 2700856

[51] Int. Cl.³ .............................................. C30B 13/20
[52] U.S. Cl. ............................. 422/250; 13/DIG. 1; 174/15 BH
[58] Field of Search .................... 422/250; 174/15 BH; 13/DIG. 1; 156/620

[56] References Cited

U.S. PATENT DOCUMENTS

| | | | |
|---|---|---|---|
| 2,904,663 | 9/1959 | Emeis et al. | 422/250 |
| 3,769,484 | 10/1973 | Stut et al. | 13/DIG. 1 |
| 3,916,079 | 10/1975 | Kohler et al. | 174/15 BH |

OTHER PUBLICATIONS

The Review of Scientific Instruments, vol. 25, No. 4, Apr. 1954, 331–334.

*Primary Examiner*—Hiram Bernstein
*Attorney, Agent, or Firm*—Hane, Roberts, Spiecens & Cohen

[57] ABSTRACT

Apparatus for growing crystals comprising a vessel having a heater therein connected to electrical feed lines which extend from the vessel through a feed housing to an electrical supply source. The electrical feed line comprises inner and outer conductors which are electrically insulated through the provision of an intermediate electrically insulative conductor, the entire assembly being sealed separately for passage through the feed housing to the vessel.

28 Claims, 4 Drawing Figures

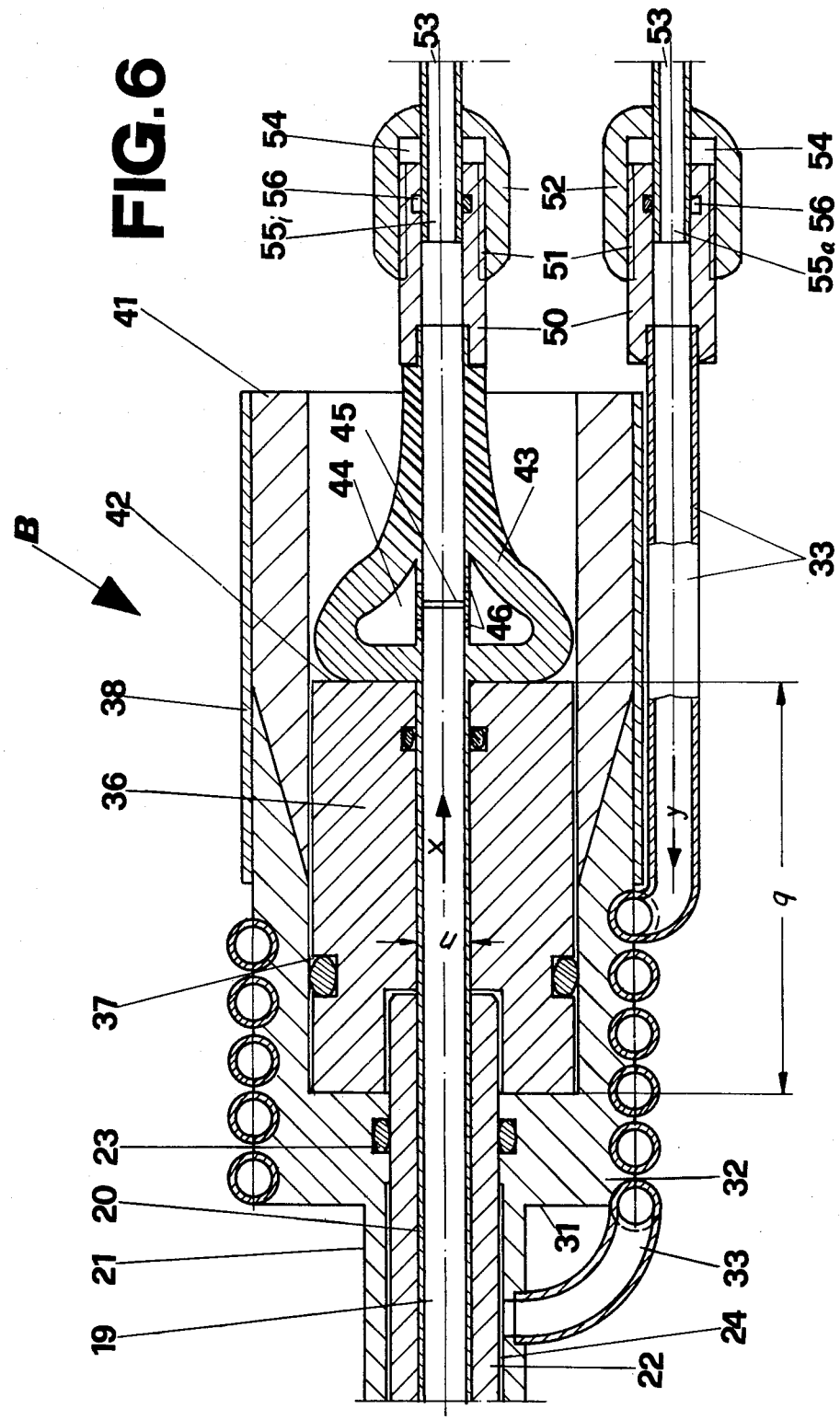

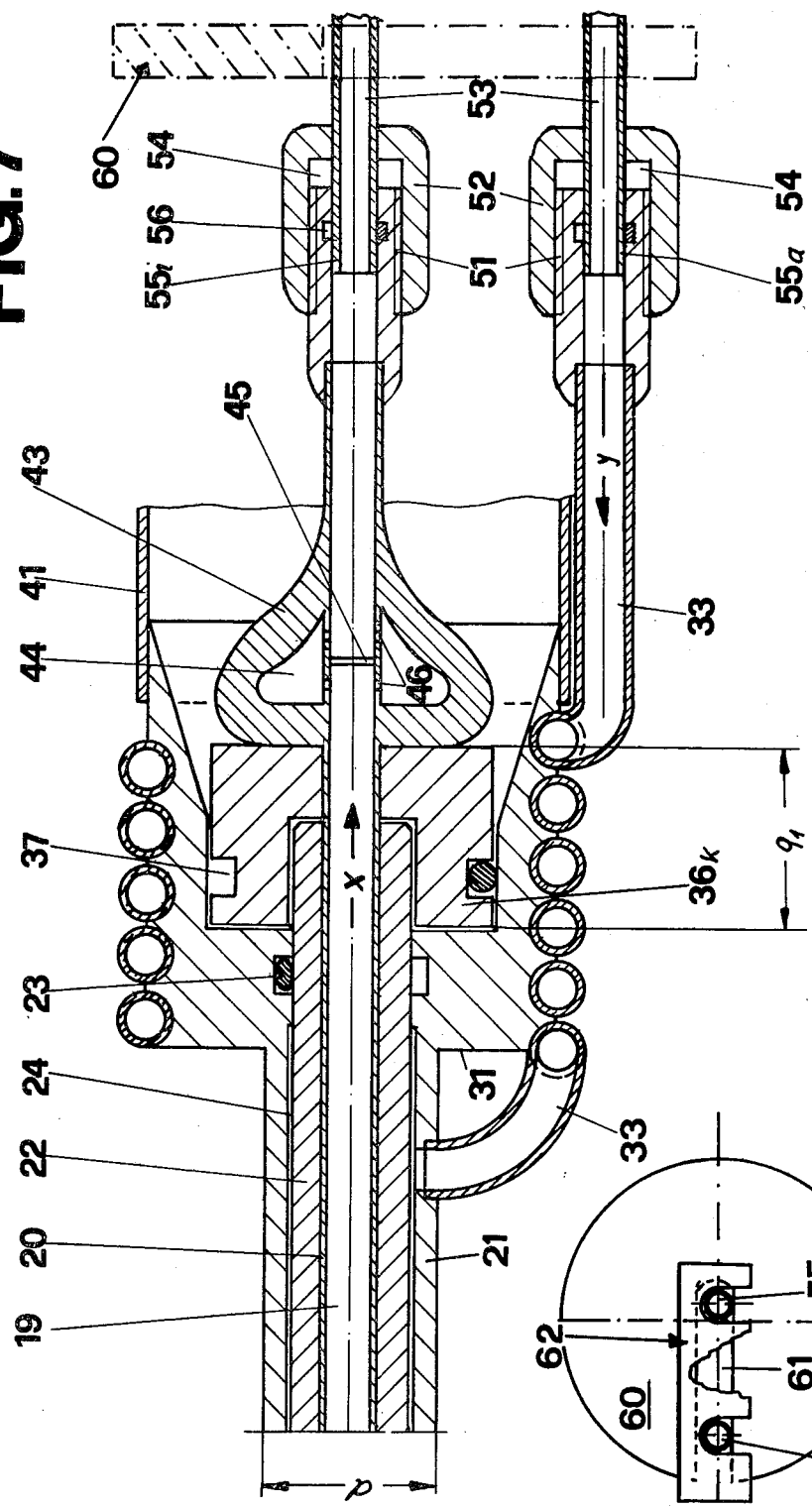

APPARATUS FOR ELECTRICAL FEED OF A HEATER IN A CRYSTAL-GROWING VESSEL

FIELD OF THE INVENTION

The invention relates to apparatus for growing crystals comprising at least one heater in a pressure-vessel and feed lines for the heater connectible to an external power-supply.

PRIOR ART

In order to grow crystals by refining materials with high vapor-pressures by recrystallization, it is necessary to use vessels which can resist at least the vapor pressure of the material concerned. High frequency is needed to melt such materials which means the high frequency must be brought into the pressure vessel. Until now attempts have been made to solve the problem with parallel feed lines. This is unsatisfactory because of the high power dissipation. An important requirement of the feed lines is that they must be resistant to aggressive media as well as be capable of resisting high gas pressures while having small electrical losses. Experience has shown that the problem of insulation gets worse the higher the frequency. Teflon seals have proved unsatisfactory even though they are pressure seals and electrically insulative. They become heated with high frequency and with increasing leakage the danger of explosion arises.

SUMMARY OF THE INVENTION

In order to avoid the mentioned disadvantages, the invention seeks to provide a device which permits the supply of high frequency current in a vessel under high pressure. Furthermore, the feed line should have a low loss rate, sustain high pressures as well as vacuum, and be inert to oxygen thus permitting the growth of desired new materials.

In order to achieve this, the invention proceeds on the basis of separating topologically the electrical insulation from the high pressure seal. The conductors are mounted as coaxial tubes insulated by an electrical insulating layer. Another device includes projections on each of the conductors mounted in bearings.

Thus, the electrical insulation and the pressure seal are separated topologically. Two coaxially mounted tubes serve as the two conductors. The impedance is reduced to a minimum. The insulation layer may be ceramic or quartz.

Between the quartz tube and the inside of the external conductor tube an annular space is provided for supply of cooling agent. A cooling line shaped as a helix surrounds the external conductor thus cooling it behind the projection.

Cooling water passes through the inner tube to the heater element and comes back through the helix and the above mentioned annular space. The flow direction is advantageous since the inner conductor tube has a higher thermal load than the outer one. This is due to the higher current density (smaller diameter). The heater is connected to the feed line with screw collars.

A projection on the outer conductor tube serves as a bearing for the inner conductor projection. The latter bears against a large electrical insulating cylinder of quartz or ceramic which itself bears against the projection of the outer conductor tube. O-rings in the quartz cylinder serve as pressure seals. Because they are remote from the inner conductor, the voltage is nearly zero. Thus, the pressure seal has no electrical load. The inner tube is also sealed by an O-ring. In order to minimize electrical losses by high frequency, the inner projection should be formed as a body generated by two half circles, whereby the body is shaped like an onion. This is cooled by circulation of the cooling agent along the sides. All parts of the device where transitions of the tubes to different diameters are necessary are made with rectangular or conical steps.

The dimensions of the quartz cylinders are such that they easily withstand the applied pressure. They are oxygen resistant. The quartz cylinders have cylindrical bores in which quartz tubes are inserted which insulate the central part of the feed line. The depth of these bores is such that electrical sparking between the inner and the outer conductor is avoided. Thus the smaller quartz tube extends relatively far in the larger tube.

The length of the large quartz cylinder (which is in effect a very thick walled tube) is determined by the electrical strength of the material as well as its mechanical properties.

It is easy to take the device apart because it is separated in two parts which are connected to another by axial couplings.

The outer conductor is constructed in two parts, one of which passes through a hole in the vessel and threadably engages the other part of the outer conductor. Each of the two parts has a flange bearing against a wall of the vessel and an excellent seal is formed when the two parts are screwed together. Between the two parts are further seals which also seal an annular space for the cooling agent (15 bars or more).

In order to prevent vapor-deposition from the conducting parts of the device, there is a shield in front of the outer conductor e.g. a plate of alumina. This can be fixed by a comb which surrounds the inner conductor. Thus it is easily dismountable.

The device is not only applicable to crystal growing, but also to glass melting, metallurgy soldering and welding.

BRIEF DESCRIPTION OF THE DRAWING

FIG. 6 is a sectional view of an end of the feed line which is inside the vessel.

FIG. 7 is a sectional view of a modified embodiment of the arrangement shown in FIG. 6.

FIG. 8 is an end view of a shield.

DETAILED DESCRIPTION

Figures 1, 2:
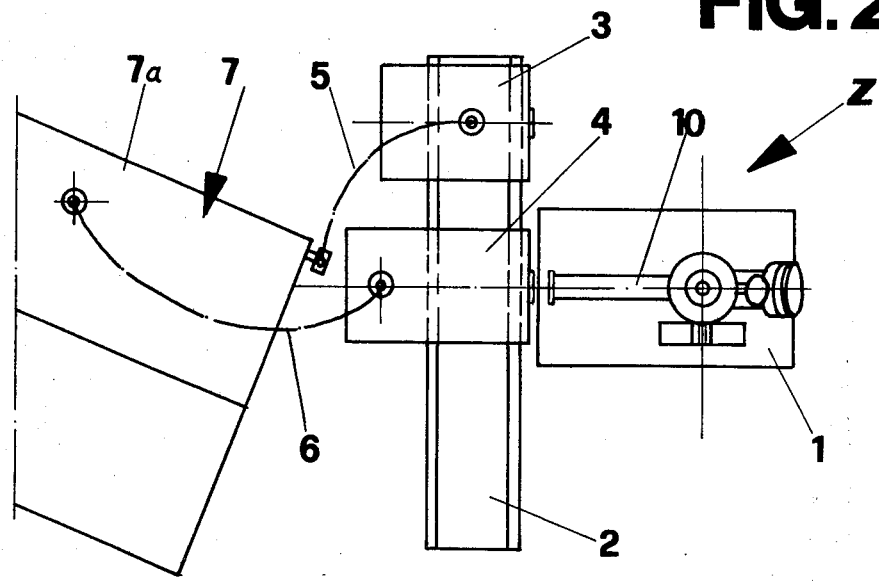
FIG. 1 is a side elevational view of a crystal growing machine with an RF-generator and outer resonant circuits.
FIG. 2 is a plan view of the apparatus in FIG. 1.

Mounted on a base 1 of height a (e.g. 1 meter) is a crystal growing machine Z for growing crystals. Mounted on a cantilever 2 which is adjustable in height are two horizontally displaceable resonant circuits 3 and 4, one for operation in the RF-range and the other for operation in the shortwave range. These resonant circuits 3 and 4 are connected to a common generator 7 by coaxial cables 5, 6. According to the operation conditions of the machine Z, one of the resonant circuits is connected to a feed line 10 of the machine Z.

The generator 7 has an oscillator 7a which is switchable easily to the desired frequencies.

Figure 3:
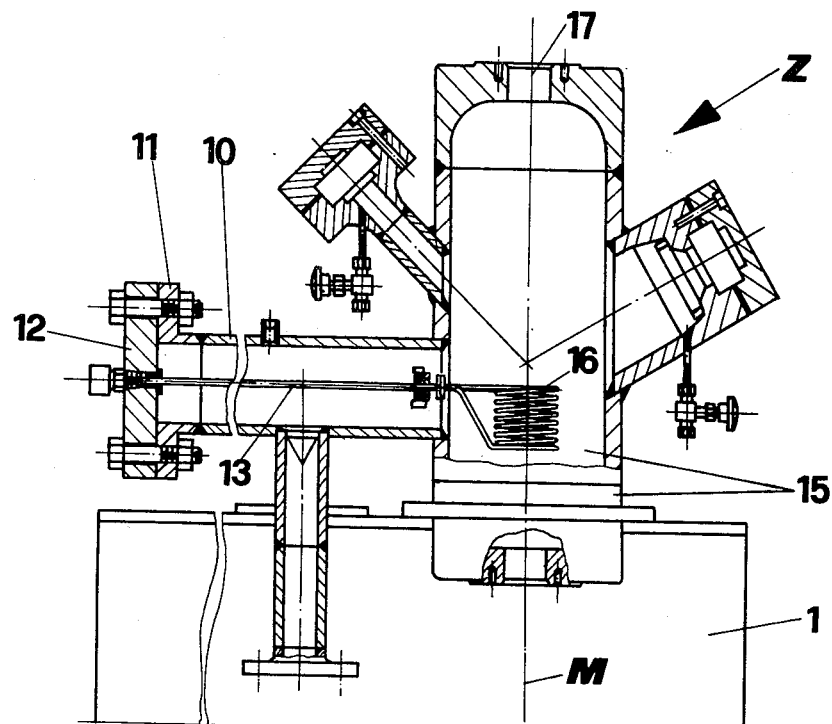
FIG. 3 is an enlarged transverse sectional view of the crystal growing machine with a conventional electrical feed line.

The feed line 10 extends horizontally in the machine Z and is shown is FIG. 3 in a conventional construction. A gasket 12 seals the flange 11 through which cables 13 pass. The gasket 12 and flange 11 constitute and end closure for the feed line 10. The other end of the feed line 10 extends inside the vessel 15. Along the central axis M of the vessel a high frequency induction coil 16 is mounted and aligned with port hole 17 at the top of the vessel for the passage of a coaxial pulling rod.

Figure 4:
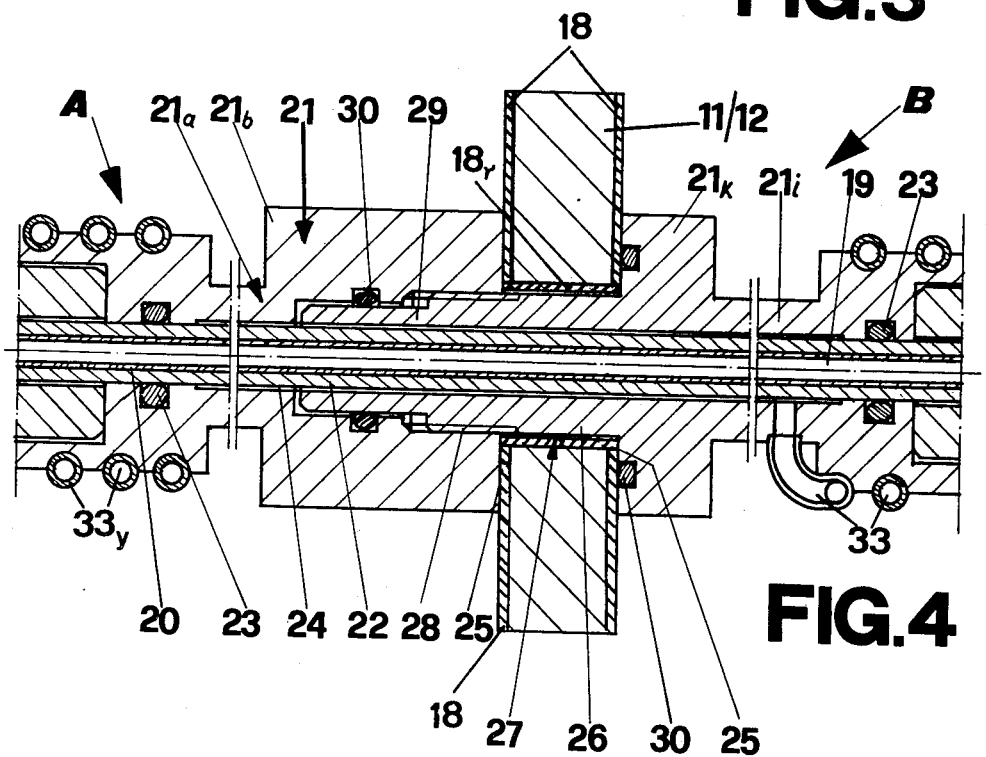
FIG. 4 is a sectional view of a central portion of a feed line of the machine according to the invention.

A current flow takes place between the resonant circuit 3 or 4 respectively and the induction coil 16, as shown in FIG. 4, by the provision of two coaxial conductor tubes 20, 21 with an isolating quartz tube 22 between them. The tube 22 is supported in the outer tube or conductor 21 between gaskets 23 such that an enclosed annular space 24 is formed through which cooling agent flows to contact the inside of the outer conductor 21. The flow of the cooling agent (arrow x) proceeds through the inside 19 of the inner conductor 20.

According to FIG. 4, the outer conductor 21 comprises an outer part $21_a$ and a separate inner part $21_i$ for mounting purposes. Both parts lie against the vessel wall 11 with respective front surfaces 25 of flanges $21_b$ and $21_K$. The electrical isolation between the vessel and the flanges 25 or the conductor tube 21 is effected by Teflon gaskets 18 or a Teflon tube $18_r$. The Teflon gaskets are not electrical isolators in a strict sense, because the current carrying parts are only the inside of the outer conductor tube and the outside of the inner conductor tube. Thus, the high frequency voltage is sustained only thereat. The above mentioned Teflon-parts are only employed if, for example, doubling of voltage is desired and the housing cannot be grounded to the outer conductor. Otherwise, the gaskets 30 might been made of metal.

A tube-like threaded part 26 of the inner part $21_i$ of the outer conductor 21 passes through an aperture 27 in the end closure 12 and is threadably engaged with threaded portion 28 of the outer part $21_a$ of the outer conductor. A shoulder-like reduced cylindrical part 29 at the end of the threaded part 26 supports an o-ring seal 30 which is received in a groove in the outer part $21_a$.

By reason of this coupling, the annular space 24 is sealed for a pressure of 15 bars despite the separability of the feed line.

Figure 5:
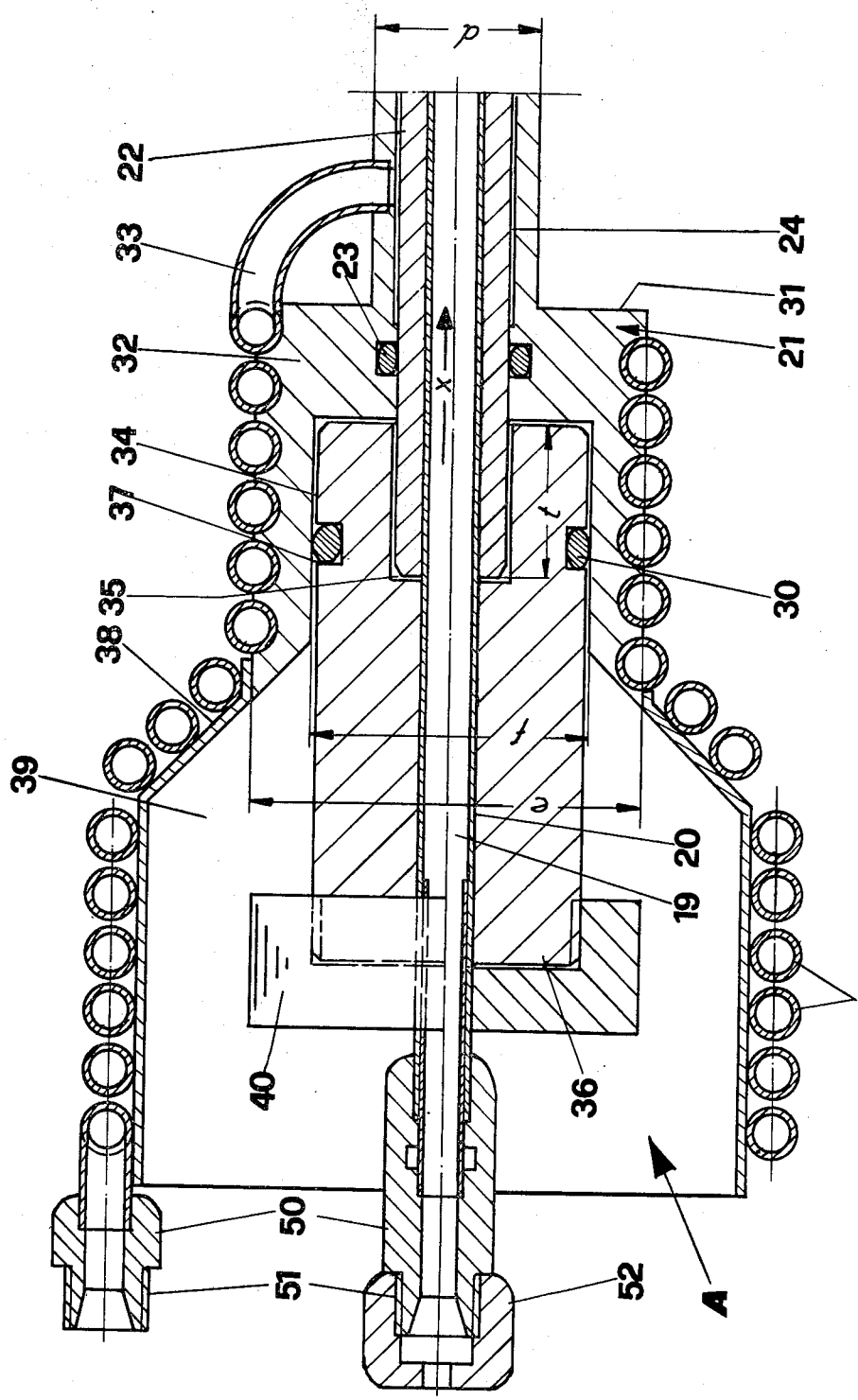
FIG. 5 is a sectional view of an end of the feed line which is outside the vessel.

If there is no need for separability or if the outer conductor can be grounded to the vessel, the outer conductor can be welded directly to the vessel allowing a much greater overall diameter of the device and thus much lower power losses. High-frequency losses are roughly porportional to the inverse of the diameter. The illustrated construction has an outer diameter of e.g. 30 mm (FIG. 5). The outer end A of the outer conductor 21 is shown on an enlarged scale in FIG. 5. It is seen that the cooling agent after having passed the annular space 24 in the direction of the arrow x (see as well FIG. 6) now passes through a helically wound tube 33. The outer conductor is increased in diameter from diameter d to diameter e.

The head of the conductor 32 has an axial internal recess 34 with diameter f in which the end of a quartz or ceramic cylinder 36 is inserted. The end of cylinder 36 is provided with a blind bore 35 of depth t. Gaskets 30 in grooves 37 pressure seal the cylinder 36 to the inside of the outer conductor $21_a$. A copper cylinder 39 has a conical portion 38 secured to the conductor 32. The cylinder 36 projects within the interior of cylinder 39 and inner conductor 20 passes through the cylinder 36. A pressure-cap 40 of ceramic is screwed onto the end of cylinder 36.

Mounted on the ends of the inner conductor 20 and the helical tube 33 are threaded cylinders 50. The cylinders 50 have threaded portions 51 for connection to caps 52 of the generator.

The internal end B of the outer conductor 21, which is in the vessel 15 has a similar construction. As seen in FIG. 6 a quartz or ceramic cylinder 36 has a frontal surface bearing against outer conductor 32 as shown in FIG. 6. A further ceramic cylinder 41 is inserted between copper cylinder 38 and the ceramic cylinder 36. An onion-like projection 43 on the inner conductor 20 bears against the other frontal surface 42 of the ceramic cylinder 36. This nearly reflection-free onion-like projection 43 prevents the inner conductor from being pushed out of the feed line.

Through a cavity 44 in the onion-like projection 43, a coolant flows due to the provision of a plate soldered in the inner conductor and holes 46 provided in the wall of the inner conductor. The flow direction is shown by the arrow x.

The outside of the copper cylinder 38 is cooled by helically formed tube 33 which is connected to the inner conductor 20 by a tube 53.

A flange 54 which is soldered on each of inlet tubes 53 of the heater is pressed against the inner conductor 20 by threaded engagement of threaded part 50 by a threaded cap 52. Ends $55_i$ and $55_a$ of inner conductor 20 and helical tube 33 are surrounded by o-rings 56. Outside the drawing the tube 53 is wound in coils.

The length q of the ceramic cylinder 36 is determined by the electrical and mechanical strength of the ceramic material as well as by the width of the external and internal grooves 37 for the gaskets 30. In FIG. 6 the length q of the ceramic cylinder 36 is three times greater than its diameter d. In FIG. 7 another example is shown where q=d.

The relation of the outer diameter d to the inner diameter n of a coaxial feed line is for
optimal power transmission, d/n=1.65;
minimal attenuation, d/n=3.6;
optimal voltage strength, d/n=2.72.

In the illustrated example a ratio of 2.72 was selected as a compromise, because here the atennuation is only 4% less than for the optimal relation of d/n=3.6.

In order to shield the parts of the feed line against vapor-deposition and radiation, a shield 60, for example, of alumina with a radial blind slot is engaged on the ends $55_a$, $55_i$ of the tube 33 and conductor 20. The remaining holes may be sealed with a comb-like piece 62 of alumina.

With this coaxial feed line, high-frequency-power may be transmitted to vacuum vessels as well as to high pressure-vessels. The feed line has been used with vessels at pressures between $10^{-6}$ torr and 300 bars with very low loss rates.

I claim:

1. Apparatus for growing crystals under vacuum and high pressure between $10^{-6}$ torr and 300 bars comprising a vessel subjected to high pressure or vacuum in an aggressive medium, a heater in said vessel and a feed line with electrical feed means therein connected to said heater and passing through said vessel for external connection with a high frequency power source for supplying high frequency electrical current to said heater, said electrical feed means comprising first means made of quartz or ceramic providing electrical isolation of said electrical feed means, and second means separate from said first means for sealing the passage of the feed means to said vessel, said electrical feed means further comprising inner and outer coaxial conductors of high-frequency current, said first means comprising a tubular insulating member coaxially interposed between the inner and outer conductors, said outer coaxial conductor including first and second coaxial parts, said second means comprising radial projecting means on said first and second coaxial parts and seal means interposed between said radial projecting means on said first and second parts and said vessel for sealing the passage of said feed means in said vessel.

2. Apparatus as claimed in claim 1 comprising a sealed annular space between the inner and outer conductors for passage of coolant therethrough.

3. Apparatus as claimed in claim 2 comprising a helically wound tube on the outer conductor connected to said annular space for flow of coolant through said helically wound tube.

4. Apparatus as claimed in claim 3 comprising means connecting said annular space with the interior of the inner conductor.

5. Apparatus as claimed in claim 3 comprising connector tubes within said vessel connecting the helically wound tube and the interior of the inner conductor.

6. Apparatus as claimed in claim 5 wherein said tubes connecting the helically wound tube and the inner conductor comprise a high-frequency heater element.

7. Apparatus as claimed in claim 6 comprising dismountable screw connections at the free ends of said inner conductor and said helically wound tube.

8. Apparatus as claimed in claim 7 wherein said dismountable screw means comprises radial projections on said connector tubes, and caps on said connector tubes threadably engageable with said helically wound tube and said inner conductor to press said radial projections against said free ends thereof.

9. Apparatus as claimed in claim 1 comprising means for supplying cooling fluid to said inner conductor.

10. Apparatus as claimed in claim 9 wherein said inner conductor comprises a hollow projection, and is provided with holes extending into said projection and a blocking plate causing flow of cooling fluid into the hollow projection via said holes.

11. Apparatus as claimed in claim 10 wherein said first means further comprises a tubular insulating bearing between the inner and outer conductors, said hollow projection bearing against said insulating bearing.

12. Apparatus as claimed in claim 11 wherein said hollow projection is a surface of revolution of onion-shape.

13. Apparatus as claimed in claim 12 wherein said outer conductor has enlarged ends, one said tubular insulating bearing being mounted in each enlarged end bearing thereagainst and surrounding the inner conductor.

14. Apparatus as claimed in claim 13 comprising o-rings mounted in grooves provided in said insulating bearings for sealing said bearing in said outer conductor.

15. Apparatus as claimed in claim 14 wherein said o-rings are made of metal.

16. Apparatus as claimed in claim 13 wherein each insulating bearing is cylindrical.

17. Apparatus as claimed in claim 13 wherein said tubular insulating member extends into recesses provided in said insulating bearings.

18. Apparatus as claimed in claim 17 wherein one of said insulating bearings is disposed within the vessel and the other outside the vessel, the apparatus further comprising an insulative pressure cap on said inner conductor bearing against said other insulating bearing, said hollow projection bearing against said insulating bearing within the vessel.

19. Apparatus as claimed in claim 18 wherein said pressure cap is detachably secured to the inner conductor.

20. Apparatus as claimed in claim 1 comprising a sealed annular space between the inner conductor and the tubular insulating member for the flow of a coolant therethrough.

21. Apparatus as claimed in claim 20 comprising sealing rings between said outer conductor and said tubular insulating member proximate the ends of said annular space.

22. Apparatus as claimed in claim 21 wherein said sealing rings are made of metal.

23. Apparatus as claimed in claim 1 wherein said feed line comprises a tubular member having an end closure through which said feed means passes, said radial projection means comprising radial projections on said outer conductor flanking opposite sides of said end closure, and seal means sealing the outer conductor to said end enclosure.

24. Apparatus as claimed in claim 23 comprising detachable connection means between said first and second parts and a seal between said parts sealing the same together.

25. Apparatus as claimed in claim 24 wherein said detachable connection means comprises a threaded connection between said first and second parts.

26. Apparatus as claimed in claim 1 comprising a shield against radiation and vapor deposition mounted on the outer conductor in said vessel.

27. Apparatus as claimed in claim 26 wherein said shield has a slot receiving said outer conductor.

28. Apparatus as claimed in claim 27 comprising a comb-like plate on said outer conductor closing the slot in said shield.

* * * * *

UNITED STATES PATENT AND TRADEMARK OFFICE
CERTIFICATE OF CORRECTION

PATENT NO. : 4,275,035
DATED : June 23, 1981
INVENTOR(S) : M. Raphael Leonhardt

It is certified that error appears in the above-identified patent and that said Letters Patent are hereby corrected as shown below:

On the title page, Item [76] should read:
-- Inventor: M. Raphael Leonhardt, Mainauweg 9, D-7750 Konstanz 19, Federal Republic of Germany --

On the title page, column 2, "4 Drawing Figures" should
--- 8 Drawing figures ---.

Signed and Sealed this

Sixth Day of April 1982

[SEAL]

Attest:

GERALD J. MOSSINGHOFF

Attesting Officer  Commissioner of Patents and Trademarks